United States Patent [19]

Shimoda et al.

[11] Patent Number: 4,618,396
[45] Date of Patent: Oct. 21, 1986

[54] GAAS SINGLE CRYSTAL AND PREPARATION THEREOF

[75] Inventors: Takashi Shimoda; Masami Sasaki, both of Itami, Japan

[73] Assignee: Sumitomo Electric Industries, Ltd., Osaka, Japan

[21] Appl. No.: 675,400

[22] Filed: Nov. 27, 1984

[30] Foreign Application Priority Data

Dec. 1, 1983 [JP] Japan .............................. 58-227247

[51] Int. Cl.$^4$ ...................... B01J 17/00; C01B 27/00; C04B 35/00
[52] U.S. Cl. .............................. 156/605; 156/617 SP; 156/617 V; 156/619; 156/DIG. 72; 156/DIG. 81
[58] Field of Search ............... 156/DIG. 81, 600, 601, 156/617 R, 617 SP, 617 V, 619, DIG. 61, DIG. 68, DIG. 72, 605, 606

[56] References Cited

U.S. PATENT DOCUMENTS

3,630,906 12/1971 Willardson et al. ................ 156/605

Primary Examiner—Frank Sever
Attorney, Agent, or Firm—Cushman, Darby & Cushman

[57] ABSTRACT

A GaAs single crystal is disclosed containing at least one impurity selected from the group consisting of In, Al, C and S, in which fluctuation of the concentration of the impurity is less that 20% throughout the crystal from which wafers having uniform characteristics can be produced, and which may be prepared by a process comprising, at a high temperature and under high pressure, pulling up the single crystal from a raw material melt containing simple substances Ga and As or GaAs compound as well as at least one impurity while controlling the concentration of As so as to keep a distribution coefficient of the impurity in GaAs within $1\pm0.1$.

8 Claims, 7 Drawing Figures

GAAS SINGLE CRYSTAL AND PREPARATION THEREOF

FIELD OF THE INVENTION

The present invention relates to a GaAs single crystal and preparation thereof. More particularly, it relates to a GaAs single crystal containing, as a dopant, an impurity such as In, Al, C and S which is homogeneously distributed throughout the crystal, particularly along its growth direction and preparation thereof.

BACKGROUND OF THE INVENTION

A GaAs single crystal is used as a substrate of an element such as a field-effect transistor, a light emitting diode, a laser diode, etc., and generally prepared by a horizontal Bridgman method (hereinafter referred to as "HB" method) or a Czochralski method (hereinafter referred to as "CZ" method).

The HB method comprises solidifying a raw material melt in a quartz boat with horizontally displacing temperature distribution. By this method, the temperature gradient can be made small, so that a single crystal with less defects is prepared. However, since the single crystal is grown in the boat, the single crystal ingot has a semicircular cross section, and the shape of wafers which are sliced from the ingot is semicircular. Therefore, the sliced wafer should be trimmed to a circular wafer. Thus, the trimmed portion is wasted, which resluts in a high cost of the wafer.

The CZ method comprises melting the raw material in a crucible, dipping a seed crystal in the raw material melt and gradually pulling the seed crystal upwards to grow a single crystal. Since the single crystal vertically grows, it is easy to prepare a single crystal ingot having a circular cross section. In addition, since the single crystal is less contaminated with impurities, the undoped single crystal has high specific resistance.

The field-effect transistor requires a substrate having high specific resistance. The substrate made from the single crystal prepared by the HB method contains Si which has migrated from the quartz boat which acts as a donor and which reduces the specific resistivity, while the GaAs single crystal prepared by the CZ method does not have such drawbacks. However, the single crystal prepared by the CZ method tends to have lattice defects since a temperature gradient on the interface between solid and liquid phases (solid-liquid interface) is large.

The lattice defect is evaluated by measuring dislocation density in the single crystal, namely number of etch pits in a unit area, which is also called etch pit density (hereinafter referred to as "EPD").

Measurement of EPD is carried out by slicing the single crystal ingot to produce a thin wafer, polishing its surface to a specular condition and etching it, whereby the part containing the dislocation appears as a small pit. The number of the pits is counted by means of a microscope. EPD is defined as number of the pits per unit area.

EPD diversely varies throughout the ingot. Generally, distribution of EPD has the following tendencies:

1. When comparing EPD of upper and lower portions of the ingot, the upper portion which is closer to the seed crystal has low EPD, and the lower portion which is closer to the tail end has more defect and larger EPD. Sometimes, the lower portion forms a polycrystal instead of a single crystal.

2. The wafer which is sliced from the ingot also has diverging EPD. The periphery of the wafer has many defects and high EPD, and the center of the wafer also has high EPD. Thus, a portion between the periphery and the center has lower EPD. Therefore, the distribution of EPD is of a W figure shape.

3. As the diameter of the ingot is made larger, the increasing rate of EPD in the periphery becomes more significant. This phenomenon and the distribution of EPD described in the above item 2 occur for the same reason. When the diameter of the ingot is large, thermal stress in a radial direction increases and thus the lattice defects in the periphery significantly increases.

A single crystal having a small diameter, for example, of 10 to 20 mm is easily grown and one having EPD of 10,000 to 50,000/cm$^2$ is comparatively easily prepared. However, it is difficult to grow a single crystal with a diameter of about 50 or 75 mm (2 or 3 inches) and low EPD.

Usually, EPD of the single crystal is from 50,000 to 150,000/cm$^2$. Even if the single crystal is grown with a smaller temperature gradient as carefully as possible, EPD is only from 10,000 to 50,000/cm$^2$.

The field-effect transistor made from a wafer having so many defects has diversely varying pinch-off voltage. Since the pinch-off voltage is one of the important parameters of the field-effect transistor, a number of devices cannot be integrated if their pinch-off voltages are not identical. In other words, for integrating the field-effect transistors on the GaAs substrate, it is indispensable to use low EPD wafers.

In the production of the light emitting diode or the laser diode. the situation is more serious. In these elements, comparatively large electric current flows through a narrow portion. Thus, if there are lattice defects, the function of the devices is abruptly deteriorated around the defects as cores. Therefore, it is highly desirable to reduce the EPD of the single crystal.

Now, several conventional methods for preparing the single crystal will be discussed.

a. Liquid Encapsulated Czochralski (LEC) method

Actually, the single crystal is pulled up by a modified Czochralski method such as the LEC method, which is explained below.

Since As has high vapor pressure, it tends to dissipate from the raw material melt. Since a melting point of a GaAs polycrystal is 1,238° C., gaseous As dissipates from the raw material melt. Thereby, the composition of the raw material deviates from the stoichiometric composition, and an ingot having many vacancies of As is prepared.

To prevent the dissipation of As, it is proposed to cover the surface of the raw material with B$_2$O$_3$ melt. Since B$_2$O$_3$ is in a liquid state at a temperature at which the raw material is molten and has a smaller specific gravity, it covers the surface of the raw material melt.

In addition to covering the surface of the raw material melt with the B$_2$O$_3$ melt, the interior of an apparatus for pulling up the single crystal is pressurized by an inert gas up to some ten Atm. Thereby, the dissipation of As is more effectively prevented.

Nowadays, the single crystal is grown by the LEC method and scarcely pulled up from an uncovered surface of the raw material melt.

b. Willardson's Method and its Theory

Willardson, Allred and Cook found for the first time that it is preferable to grow a single crystal while doping an impurity so as to increase electron mobility in a single crystal semiconductor of a III–V group compound.

U.S. Pat. No. 3,496,118 issued on Feb. 17, 1970 discloses the Willardson's method and theory, the disclosure of which is hereby incorporated by reference.

This method can be applied not only to the GaAs single crystal but also to those of GaP, GaSb, InAs, InP, InSb, AlP, AlAs, AlSb, etc.

The Willardson's theory seems to the present inventors that it is not necessarily correct. However, it is far superior to the methods prior to this theory.

The technical concept of Willardson et al is as follows:

The electron mobility in the single crystal semiconductor must be increased. One of the causes for the decrease of the electron mobility is due to the lattice defect, which means dislocation. Further, impurities form electron scattering centers, thereby the mobility is decreased. Thus, imperfection of the single crystal such as dislocation should be eliminated or at least diminished.

Willardson et al describe that it is easy to grow a single crystal of a III–V group compound having a melting point lower than 900° C. such as GaSb, InSb, etc. Then, they think that if a melting point of a compound having a melting point higher than 900° C. were lowered, it should be possible to grow a single crystal having improved perfection.

It is well known that a melting point, namely a freezing point of a solvent is lowered by the addition of a solute. Then, Willardson et al have an idea to add an impurity to the raw material melt so as to lower its freezing point.

According to Willardson et al, it is preferred to lower the freezing point by 100° C. or more. However, a large amount of the impurity should be added to greatly decrease the freezing point since the degree of the freezing point depression is substantially in proportion to the amount of the impurity. If the single crystal contains a large amount of the impurity, it forms the electron scattering center to decrease the electron mobility and further induces the generation of new lattice defects, which must be avoided. Thus, Willardson et al try to find an impurity which can be contained in a melt but which penetrates less in a solid, thereby the impurity is occluded from the single crystal. They then introduced the concept of a distribution coefficient. The distribution coefficient is a ratio of an amount of a solute material (impurity) to be contained in a unit amount of a solid matrix material to that to be dissolved in a unit amount of a liquid matrix material when the matrix material is in a thermal equilibrium state and its solid and liquid phases coexist.

The distribution coefficient is a phenomenological value and defined only when the material is in the equilibrium state.

When the distribution coefficient is larger than 1, the impurity is less soluble in the liquid and more contained in the solid. On the contrary, when it is less than 1, the impurity is less contained in the solid and more soluble in the liquid.

Thus, the impurity which Willardson et al try to find is one having a small distribution coefficient in the III–V group compound.

When an impurity has a small distribution coefficient, a large amount of the impurity can be added to the raw material melt and the melting point (freezing point) is greatly lowered, for example, by 100° C. or more. Furthermore, since the impurity hardly migrates from the liquid phase to the solid phase during pulling of the single crystal, the concentration of the impurity in the single crystal may be kept low and the lattice defects due to the presence of the impurity may be greatly diminished.

Willardson et al pointed out that even if the distribution coefficient is constant, the concentration of the impurity is not constant throughout the single crystal.

As the single crystal is pulled up, the amount of the raw material melt decreases. When the distribution coefficient is smaller than 1, the impurity is less contained in the single crystal and accumulated in the melt. Therefore, the concentration of the impurity in the melt gradually increases. The single crystal pulled up from the raw material containing the impurity in a higher concentration inevitably contains the impurity in a higher concentration. Thus, the upper portion of the single crystal ingot near the seed crystal contains the impurity in a lower concentration but the lower portion grown at a later stage contains it in a higher concentration.

According to Willardson et al, a concentration C of an impurity having a distribution coefficient k in the single crystal is expressed by the following equation:

$$C = kC_0(1 \times g)^{k-1} \quad (1)$$

wherein $C_0$ is a constant, and g is a weight ratio of a solidified fraction in a raw material melt, which is lower than one. At the beginning of the pulling up of the single crystal, the ratio g is zero, and it increases as the single crystal grows.

Figure 1:
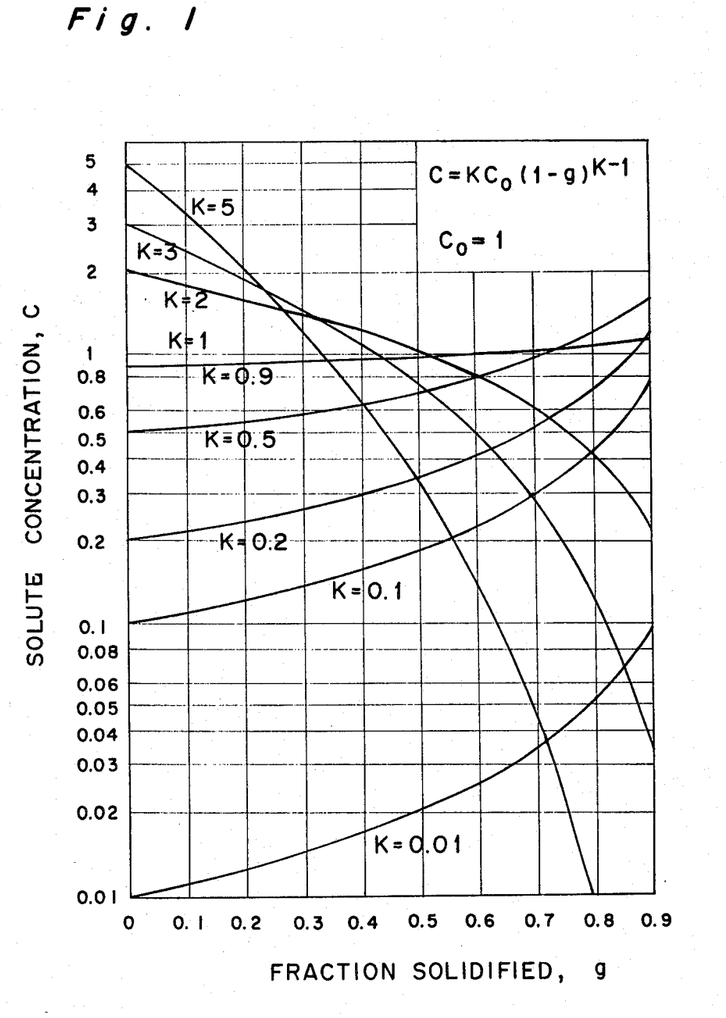
FIG. 1 is a graph showing the relation between the concentration of the impurity (solute) and the solidified fraction with various distribution coefficients k given by Willardson et al.

FIG. 1 shows a graph given by Willardson et al. In this graph, the distribution coefficient k varies from 0.01 to 5, and $C_0$ is fixed at one.

Willardson et al do not disclose any ground for the equation (1), but the present inventors assume as follows:

Assume that, initially, the weight of the raw material melt contained in the crucible is $L_0$. If a solidified ratio is g, the weight of the solidified fraction (crystallized fraction) is $L_0 g$. Thus, the weight of the remaining raw material melt is $L_0(1-g)$.

Further, assume that the raw material melt contains the impurity in an amount of m (weight), a microamount of a newly solidified fraction is $d(L_0 g)$ and the amount of the impurity decreases by dm, which is contained in the newly solidified fraction.

The distribution coefficient k is a ratio of the concentration of the impurity in the melt:

$$\frac{m}{L_0(1-g)} \quad (2)$$

to that in the solidified part. Since the materials do not transfer each other, a fraction which is in the equilibrium state against the liquid is the newly solidified fraction.

Since the weight of the newly solidified fraction is $d(L_0 g)$ and the weight of the impurity contained in this fraction is −dm, the concentration of the impurity contained in the solid is given by:

$$\frac{(-dm)}{d(L_0 g)} \qquad (3)$$

Since the distribution coefficient is the ratio of the formula (3) to the formula (2), the following differential equation is derived:

$$\frac{km}{L_0(1-g)} = \frac{-dm}{d(L_0 g)} \qquad (4)$$

By solving the differential equation (4), the following equation is obtained:

$$m = m_0(1-g)^k \qquad (5)$$

wherein $m_0$ is an initial amount of the impurity and m is an amount of the impurity contained in the melt. Thus, the concentration of the impurity is $$\frac{m_0}{L_0}(1-g)^{k-1} \qquad (6)$$

The concentration C of the impurity contained in the solid fraction is k times of the equation (6). Thus, $$C = kC_0(1-g)^{k-1} \qquad (7)$$

wherein $C_0$ is $m_0/L_0$, which is identical to the Willardson's equation (1).

In FIG. 1, the concentration C of the impurity in the solid fraction is expressed as a function of the solidified ratio g and plotted on a logarithmic scale.

When k is larger than one, the concentration of the impurity increases as the solidified ratio g increases. When k is smaller than one, the concentration of the impurity decreases as the solidified ratio g increases.

As is seen from the equation (8), $C_0$ is the initial concentration of the impurity. Since the freezing point depression is in proportion to the concentration of the impurity, the same concentration affords the same freezing point depression. Among the impurities having the same freezing point depression effect, ones which are less contained in the solid are preferred. Therefore, k is preferably less than one and as small as possible.

Then, the following conditions are given by Willardson et al:

1. The distribution coefficient is less than 0.02.
2. An impurity which decreases the freezing point by 100° C. or more is to be added.

According to Willardson et al, in the case of an AlSb crystal, impurities having the k value less than 0.02 are B, Co, Cu, Pd, Mn and Ni; in the case of a GaSb crystal, only Cd; in the case of an InAs crystal, none; in the case of an InAs crystal, Cu, Ge, Au and Ni. Willardson et al describe that impurities having a k value less than 0.02 for GaAs crystal are Sb, Bi, Cd, Ca, Cr, Co, Cu, Fe, Pb and Ni.

However, Willardson et al also describe that the kind of an impurity to be added is defined not only by the distribution coefficient but also by a diffusion coefficient.

An impurity having a large diffusion coefficient moves throughout the crystal and renders the electrical properties of the crystal unstable. For example, Cu in the GaAs crystal has a distribution coefficient less than 0.002, which is one tenth of the upper limit of k, but a diffusion coefficient which is too large. Thus, Cu is unsuitable because the GaAs crystal loses its high specific resistivity and becomes conductive due to the presence of Cu.

Willardson et al describe that, particularly for the GaAs crystal, Sb, Bi, In and Pb lower the freezing point and decrease the lattice defects and any of them should be added in a concentration larger than $1 \times 10^{18}/cm^3$. According to Willardson et al, their distribution coefficients in GaAs are as follows:

Sb: 0.016 or less
Bi: 0.0005
In: 0.1
Pb: 0.0002 or less.

Willardson et al pull up the single crystal by a specific modified CZ method, which is different from the LEC method. According to the CZ method, the single crystal is pulled up from a raw material melt consisting of polycrystalline GaAs, Ga alone or As alone and an impurity in a crucible. According to Willardson et al, Ga and the impurity such as Sb are, however, charged in the crucible, and As is charged in a container outside the crucible. The temperature of the As is kept at 605° C. and the crucible is kept at a temperature higher than 605° C. As vapor migrates in the melt in the crucible to form the GaAs melt. Then, the seed crystal is dipped in the melt and pulled up with rotation.

The melt is not covered by any other melt as in the LEC method to keep an equilibrium state between the As vapor and As in the melt. The interior of the chamber except the crucible must be kept at 605° C.

In the crucible, the GaAs melt is kept at a temperature lower than its melting point 1,238° C. since the temperature is lowered by the impurity. As Willardson et al describe that the temperature is lowered by 100° C. or more, the temperature of the GaAs melt may be about 1,100° C.

In the working examples of Willardson et al, the GaAs crystal containing the impurity such as Sb, Pb or Bi was grown. According to the working examples, the electron mobility in many cases is from 2,000 to 3,000 cm²/Vsec. in many cases and, in some cases, from 3,000 to 4,000 cm²/Vsec. These crystals contain additional impurities such as Te and Se to make n-type semi-conductors.

Willardson et al do not include any working example using In as the impurity.

Willardson et al measured only the carrier concentration in the single crystal and the electron mobility. They did not describe EPD, which might not be measured.

c. Questions on Willardson's Theory

As described above, the Willardson's theory is very interesting in that it connects the distribution coefficient with the freezing point depression.

However, the actually measured values in the working examples are the electron density and mobility.

Since the electron mobility decreases as the electron density increases, only these two values are not sufficient to evaluate the characteristics of the crystal. By taking these matters into consideration, the electron mobility of 2,000 to 3,000 cm²/Vsec. is not large. The disclosure of Willardson et al does not include any measurement other than the electron mobility and thus is insufficient.

It seems to the present inventors that there is no direct relationship between the number of the lattice defects and the electron mobility. Thus, Willardson et al should have measured EPD if the lattice defects decrease by the addition of the impurity.

The evaluation of the freezing point depression by Willardson et al is also questionable.

For example, molar depression of freezing point $K_f$ of camphor which is known to have large $K_f$ is 40° C. This means that when one mole of an impurity compound is dissolved in 1,000 g of camphor, a freezing point of camphor is lowered by 40° C. $K_f$ of water is 1.86° C. and that of benzene is 4.9.

Number of molecule $n_1$ of a compound in a unit volume is expressed as follows:

$$n_1 = N_0 \rho / M \quad (9)$$

wherein $N_0$ is the Avogadro number, M is a molecular weight the compound and $\rho$ is density of the compound.

When $n_2$ molecules (number of molecule in a unit volume) of an impurity is dissolved in 1,000 g of this compound, mole number $m_2$ of the impurity is expressed as follows:

$$m_2 = \frac{1,000}{M} \cdot \frac{n_2}{n_1} \quad (10)$$

When $n_1$ is substituted by the equation (9)

$$m_2 = \frac{1,000}{N_0 \rho} n_2 \quad (11)$$

According to Willardson et al, $n_2$ is equal to or larger than $1 \times 10^{18}/\text{cm}^3$. When $\rho$ is, for example, 5 g/cm$^3$, $$m_2 \geq \frac{1}{3,000} \text{ mol/Kg} \quad (12)$$

If $10^{18}/\text{cm}^3$ of the impurity could lower the freezing point by 100° C., $\Delta T_f$ of the compound should be $$\Delta T_f = 3,000 \times 100° \text{ C./mol} \quad (13)$$
$$= 3 \times 10^5 \text{ °C./mol}$$

This is ten thousand times larger than that of camphor. It cannot be believed that GaAs melt has such a large molar depression of freezing point.

In other words, by $10^{18}/\text{cm}^3$ of the impurity, the freezing point can be depressed by at most 0.01° C. and never by 100° C.

The reason why Willardson et al concluded that the lattice defects are decreased by depressing the freezing point is that they thought it possible to reduce the temperature gradient in both longitudinal and radial directions and, in turn, thermal strain. However, the freezing point depression by 0.01° C. is insufficient to obtain the results intended by Willardson et al.

As stated above, the evaluation of the freezing point in the Willardson's theory may be incorrect.

The Willardson's theory has a further drawback that the temperature of the crucible cannot be controlled. According to Willardson et al, only the crucible is kept at a temperature higher than other part of the chamber which is kept at 605° C. to keep the As pressure constant, and the melt in the crucible does not contain As.

The temperature $T_h$ of the crucible is not adjusted, for example, by a heater, but is controlled by a melting point $T_m$ of the raw material in the crucible and the degree of the freezing point depression $\Delta T_f$ as follows:

$$T_h = T_m - \Delta T_f \quad (14)$$

Since the concentration of the impurity varies during the pulling up step, $\Delta T_f$ varies and, in turn, $T_h$ varies. Therefore, the temperature of the melt in the crucible is not a controllable variable, so that it is impossible to control the temperature gradient in the radial direction of the crystal. That is, the number of the variables is insufficient, which is a fundamental defect of the Willardson's theory.

Willardson et al describe the data on the electron mobility but do not describe that the lattice defects are decreased by their method.

In conclusion, although Willardson et al propose to add an impurity having a distribution coefficient smaller than 0.02 to the raw material melt in an amount of $10^{18}/\text{cm}^3$, comparable effect is not obtained.

d. Mil'vidsky Theory

Mil'vidsky, Osvensky and Shifrin disclose experimental results about the effect of doping on generation of dislocation in a single crystal semi-conductor such as Ge and GaAs and theoretically analyzed them (cf. Journal of Crystal Growth, 52, 396–403, 1981, the disclosure of which is hereby incorporated by reference).

When the single crystal is pulled up from the raw material melt in the crucible, the temperature of the crystal drops as it goes away from an interface between the liquid and solid. As the temperature drops, shearing stress is generated.

When the single crystal has a melting point $T_m$, according to the Mil'vidsky theory, the dislocation is generated at a temperature range higher than $0.7 T_m$. Since the crystal is rather soft at such a temperature range, the dislocation is generated even by a very weak shearing stress.

When the shear is less than $10^{-5}$ to $10^{-4}$ times the rigidity G of the single crystal, no dislocation is generated in said temperature range. This is less than one tenth of the yield stress.

Then, the Mil'vidsky's theory introduces critical shearing stress $\tau_c$. This is a criterion to determine whether the dislocation is generated or not. When the shearing stress is larger than the critical shearing stress, the dislocation is generated. When it is less than the critical shearing stress, no dislocation is generated.

The critical shearing stress is large at a low temperature and small at a high temperature. At a temperature not lower than $0.7 T_m$, the critical shearing stress is very small.

What is important is that the critical shearing stress increases when the impurity is added to the crystal. Mil'vidsky et al explain the reason for this as follows:

They consider "dislocation mobility". They suppose that the dislocation moves as a substance and the dislocation is formed after the substance moves. Under shear, it moves vigorously and thus the multiplication rate of the dislocation increases. Under such circumstance, when the impurity is present in the crystal, it prevents the movement of the dislocation and, in turn, the multiplication of the dislocation.

Efficiency to prevent the dislocation mobility is directly proportional to the square of the difference between the volume $V_0$ of the mother element in which the impurity is added and the volume $V_1$ of the impurity and inversely proportional to a diffusion coefficient D of the impurity atom. Thus, the effect to prevent the movement of the dislocation is proportional to a factor Q which is defined as follows:

$$Q = \left(\frac{V_1 - V_0}{V_0}\right)^2 / D \tag{15}$$

Figure 2:
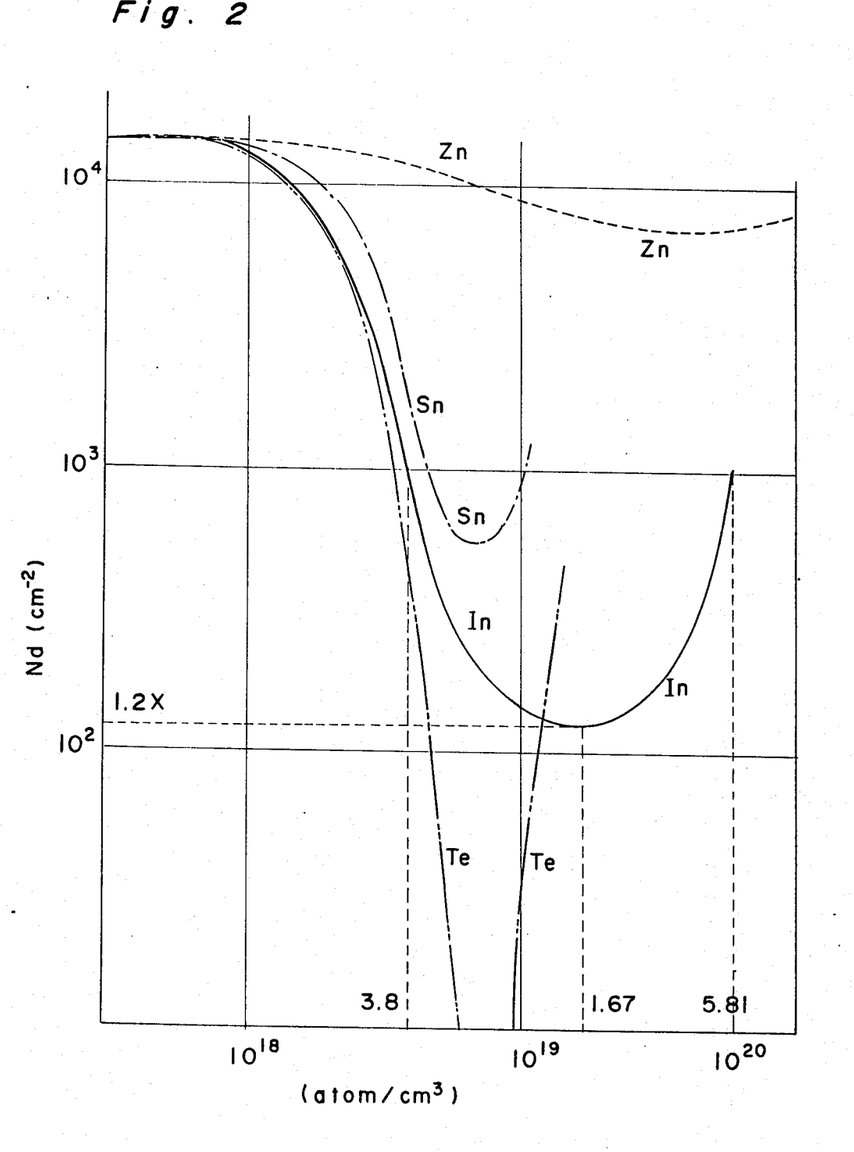
FIG. 2 is a graph showing the relations between Nd (EPD) and the concentrations of the impurities Te, In, Sn and Zn in the GaAs single crystals pulled up by the LEC method according to Mil'vidsky et al.

As the ground for the above discussion, Mil'vidsky et al offer the experimental data showing that when the GaAs single crystal is grown by the LEC method, EPD decreases by the addition of Te, In, Sn or Zn, which data are shown in FIG. 2 in which the abscissa and the ordinate correspond to the concentration of the impurity and the Nd (which is the same as EPD), respectively.

The diameter of the single crystal is from 20 to 25 mm. When the doped amount of Te is from $5 \times 10^{18}$ to $1 \times 10^{19}$/cm$^3$, Nd is less than 10/cm$^2$. Next to Te, In is preferred and, from FIG. 2, the concentration of In and Nd (i.e. FPD) read as follows:

1. In=0 (non-doped), Nd=$1.4 \times 10^4$/cm$^2$
2. In=$3.8 \times 10^{18}$/cm$^3$, Nd=$1 \times 10^3$/cm$^2$
3. In=$1.5 \times 10^{19}$/cm$^3$, Nd=$1.2 \times 10^2$/cm$^2$
4. In=$5.8 \times 10^{19}$/cm$^3$, Nd=$1 \times 10^3$/cm$^2$ The maximum concentration of In appears in Case 4 and no datum is given for higher concentration than $5.8 \times 10^{19}$/cm$^3$. The minimum Nd appears in Case 3 and the best Nd of 120/cm$^2$ is obtained. In a range between Cases 2 and 3, when the concentration of In is expressed by the following formula:

$$In = n_i \times 10^{19}/cm^3 \tag{16}$$

Nd is given by the following approximate equation:

$$\log Nd = 2.669(\log n_i \times 0.176)^2 + 2.077 \tag{17}$$

Although no datum is available at $n_i$ larger that 5.8 (i.e. Id=$5.8 \times 10^{19}$/cm$^3$), by extrapolation according to the equation (17), Nd is calculated, for example, as 1,870/cm$^2$ when $n_i$ is 7.

In addition to the data for Te and In, data for Sn and Zn are shown.

The parameter Q in GaAs kept at 1,100° C. defined by the equation (15) are as follows:

1 For Te, Q=$8 \times 10^{10}$ sec/cm$^2$.
2. For In, Q is not calculated since D is not known.
3. For Sn, Q=$2 \times 10^{10}$ sec/cm$^2$.
4. For Zn, Q=$1.5 \times 10^7$ sec/cm$^2$.

These EPD data are given by using the concentration of the impurity as a single variable. However, Nd is not uniform throughout the single crystal ingot or in one wafer either. EPD values shown in FIG. 2 are those obtained in a part of the ingot in which EPD is minimum. That is, EPD shown in FIG. 2 are the best ones.

When In=$1.5 \times 10^{19}$/cm$^3$, the best EPD is 120/cm$^2$, but the ingot include a part in which EPD is from 10,000 to 100,000/cm$^2$.

e. Defects of Mil'vidsky Theory

Mil'vidsky et al explain the effect of the dislocation decrease based on the difference of the volume of the impurity, which is very interesting.

However, the theory may include the following defects:

Firstly, as explained by the equation (15), the volume effect starts from the square of the volume difference.

When In or Al is added to GaAs and it occupies the Ga site, In has a larger diameter than that of Ga and Al has a smaller diameter than that of Ga. Since the volume effect is quadratic, Al and In have the same effect. However, the first degree effect should be present, which is represented as follows:

$$Q_1 = (V - V_0)/V_0 \tag{18}$$

It is questionable that $Q_1$ has no effect to prevent the dislocation. In other words, there should be some difference between Al and In when they are added to GaAs as the impurities.

Another question is a probability by which the effect is obtained. When the concentration of In impurity is $N_1$, the first degree effect should be obtained in the probability proportional to $N_1$.

Since the number of atoms of the matrix compound is of an order of $10^{22}$/cm$^3$, the concentration of the impurity of $10^{-3}$ is achieved by $10^{19}$/cm$^3$ of the impurity.

Since the effect Q defined by the equation (15) is the second degree, it is obtained in the probability proportional to $(N_1)^2$ and estimated to be $10^{-6}$.

In the single crystal, the dislocation may be regarded as a line which propagates in the axial direction of the crystal. When the dislocation line meets the impurity atom, the dislocation is prevented, which is the opinion of Mil'vidsky et al. It is questionable that the factor Q having a collision cross section on the order of $10^{-6}$ blocks the dislocation on the order of 100,000/cm$^2$ to reduce the latter to 100 to 1,000/cm$^2$.

Further, in the equation (15), the square of the difference of the volumes is divided by the diffusion coefficient D. We think this is because Mil'vidsky et al found that, between two elements having the substantially the same square of the volume difference, the factor Qs are different and thus they tried to have reasonable results by dividing the square of the volume difference by the diffusion coefficient D.

Now, Te will be discussed since it is said to be the best impurity according to Mil'vidsky et al.

An ionic radius of $-3$ valent As ion is 2.00 Å, and that of $-2$ valent Te ion, 2.21 Å. On the other hand, that of $+3$ Ga ion is 0.62 Å, and that of $+4$ Sn ion, 0.69 Å.

If an As site is replaced with Te, the volumes do not substantially change, so that the square of the volume difference is nearly equal to zero (0). Thus, Mil'vidsky et al might divide the square of the volume difference by D, since they thought that if the impurity element which should prevent the propagation of the dislocation would thermally move, it might come out by the dislocation energy.

Introduction of a phenomenological factor such as the diffusion coefficient does not necessarily deepen the understanding of the result.

According to the Einstein's relation:

$$D = \mu kT$$

wherein $\mu$ is mobility of an atom, k is the Boltzmann's constant and T is an absolute temperature, D is large at a high temperature.

The multiplication of the dislocation occurs most vigorously at a high temperature between $T_m$ and $0.7T_m$. On the contrary, the factor Q is small at a high temperature but large at a low temperature. Thus, it is unbelievable that the vigorous propagation of the dislocation can be prevented by the factor Q.

Then, Mil'vidsky et al introduce an idea of critical shearing stress $\tau_c$, which varies depending on the temperature and the concentration of the impurity.

As the concentration of the impurity $N_1$ increases, the critical shearing stress increases. It is understood that the factor Q of the equation (15) acts according to the influence of $N_1$, but the reason why the critical shearing stress increases is not explained. Mil'vidsky et al thought that the shearing stress itself is large at the center and periphery of the wafer to explain the fact that the large number of the dislocation is found there.

The concept that the dislocation is generated by the shearing stress is too intuitive and questionable. This is clear from consideration of the strength of the material.

Since the single crystal is of a cylindrical form, it is cooled from the periphery while being pulled up from the raw material melt. Since, therefore, the core portion has a high temperature while the periphery is cooled, stress is generated.

Since the single crystal has cylindrical symmetry, a cylindrical coordinate is superposed on it so as to have Z and r axes in the axial and radial directions of the crystal, respectively. For simplicity, the distribution in the Z direction is not taken into account. Because of the cylindrical symmetry, dependency on an angle $\theta$ is neglected.

Tensile stresses in the radius direction and in the angle direction are $\sigma r$ and $\sigma t$, respectively.

From the equilibrium of forces in a minute area of dr and $d\theta$, the following equation is obtained:

$$\frac{d}{dr}(r\sigma r) = \sigma t \tag{19}$$

Variation at a point r is expressed by v(r). Then, the linear expansion rate $\epsilon r$ in the direction r at this point is given by the equation:

$$\epsilon r = \frac{dv}{dr} \tag{20}$$

and the linear expansion rate $\epsilon t$ in the angle direction at this point is given by the equation:

$$\epsilon t = \frac{v}{r} \tag{21}$$

When temperature is kept constant, tensile stresses in the radius direction and in the angle direction $\sigma r'$ and $\sigma t'$, respectively are expressed by the following equations:

$$\sigma r' = \frac{E}{1 - (1/m^2)}\left(\frac{dv}{dr} + \frac{1}{m}\frac{v}{r}\right) \tag{22}$$

$$\sigma t' = \frac{E}{1 - (1/m^2)}\left(\frac{1}{m}\frac{dv}{dr} + \frac{v}{r}\right) \tag{23}$$

wherein m is Poisson's ratio and E is Young's modulus.

When linear material having a coefficient of linear expansion $\alpha_1$ is cooled with both ends fixed from a temperature t to a temperature $t_0$, the following thermal stress is generated in the material:

$$-\alpha_1 E(t - t_0) \tag{24}$$

When temperature is a function of r, the total stresses $\sigma r$ and $\sigma t$ are give by the sums of the thermal stress and the equation (22) and (23), respectively as follows:

$$\sigma r = \frac{E}{1 - (1/m^2)}\left(\frac{dv}{dr} + \frac{1}{m}\frac{v}{r}\right) - \alpha_1 E(t - t_0) \tag{25}$$

$$\sigma t = \frac{E}{1 - (1/m^2)}\left(\frac{1}{m}\frac{dv}{dr} + \frac{v}{r}\right) - \alpha_1 E(t - t_0) \tag{26}$$

The equation (19) is substituted in these two equations to give:

$$\frac{d^2v}{dr^2} + \frac{1}{r}\frac{dv}{dr} - \frac{v}{r^2} - \alpha_1\left(1 - \frac{1}{m^2}\right)\frac{dt}{dr} = 0 \tag{27}$$

The temperature difference $(t_0-t)$ is zero at the core of the crystal and increases toward the periphery. For simplicity, the temperature increase is hypothetically approximated to the following quadric function:

$$t_0 - t = ar^2 \tag{28}$$

With this approximation, the equation (27) is represented as follows:

$$\frac{d^2v}{dr^2} + \frac{1}{r}\frac{dv}{dr} - \frac{v}{r^2} = -qr \tag{29}$$

wherein $q = 2a\alpha_1[1-(1/m^2)]$ (30)

A general solution of the equation (29) in which the right side is zero is give by the following equation:

$$v = c_1 r + \frac{c_2}{r} \tag{31}$$

Now, $-qr$, the right side of the equation (29) is discussed. The special solution of the equation (29) is to be given. Since the right side is of the first degree, the left side is also of the first degree. Thus, there should be present the special solution of:

$$v = kr^3 \tag{32}$$

The equation (29) is substituted by this special solution to give:

$$8kr = -qr \tag{33}$$

Thus, $$k = -(\tfrac{1}{8})q \tag{34}$$

In the above equations, v is the displacement of the continuous body. Since, at the center of the crystal ingot, r is zero and the displacement should not diverge, $c_2$ in the equation (31) is zero.

The general solution of the equation (29) is represented by the following equation:

$$v = c_1 r - (q/8)r^3 \tag{35}$$

The equations (25) and (26) are substituted in this equation with making reference to the equations (28) and (30) to give stresses as follows:

$$\frac{\sigma r}{E} = \frac{c_1}{1 - (1/m)} + \frac{r^2 a\alpha_1}{4}\left(1 - \frac{1}{m}\right) \tag{36}$$

$$\frac{\sigma t}{E} = \frac{c_1}{1 - (1/m)} + \frac{r^2 a\alpha_1}{4}\left(3 - \frac{1}{m}\right) \tag{37}$$

The radius of the ingot is R. When r=R, there is given a boundary condition such that the stress in the radial direction $\sigma r$ is zero. Then, $c_1$ is expressed by the following equation:

$$c_1 = -\left(1 - \frac{1}{m}\right)^2 \frac{a\alpha_1 R^2}{4} \tag{38}$$

From the equations (36) and (37), $$\frac{\sigma r}{E} = -\left(1 - \frac{1}{m}\right) \frac{a\alpha_1}{4}(R^2 - r^2) \tag{39}$$

$$\frac{\sigma t}{E} = -\left(1 - \frac{1}{m}\right) \frac{a\alpha_1}{4}\left(R^2 - \frac{3m-1}{m-1}r^2\right) \tag{40}$$

The stress in the radial direction is always negative in the range of 0≦r≦R, that is, compressive stress. Thus, it is maximum when r is zero, namely, at the core of the ingot, and it decreases as r reaches R.

The stress in the axial direction is compressive stress when r=zero, equal to zero when r=$r_1$ and tensile stress when r is larger then $r_1$, in which $$r_1 = \left(\frac{m-1}{3m-1}\right)^{-\frac{1}{2}} R$$

Figure 3:
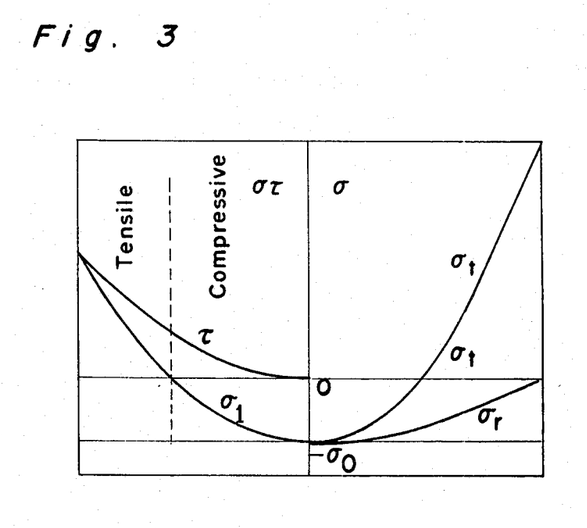
FIG. 3 shows the stresses in the radial and axial directions, the principal stress in the direction having an angle of 45° to the radius and the shear force as functions of the radius.

The right half of FIG. 3 shows the stress in the radial and axial directions with r being a variable.

For simplicity, normalized stress $\sigma_0$ is defined as follows:

$$\sigma_0 = \frac{Ea\alpha_1 R^2}{4}\left(1 - \frac{1}{m}\right) \tag{41}$$

Then, $$\sigma r = -\sigma_0\left(1 - \frac{r^2}{R^2}\right) \tag{42}$$

$$\sigma t = -\sigma_0\left(1 - \frac{(3m-1)r^2}{(m-1)R^2}\right) \tag{43}$$

In the radial and axial directions, the shearing stress is zero.

Now, the stress is analyzed in a coordinate system placed at an angle $\theta$ against the radial direction.

According to Mohr's stress relations, tensile stress $\sigma_1$ and $\sigma_2$ and shear force $\tau$ are represented as follows:

$$\sigma_1 = \sigma r \cos^2\theta + \sigma t \sin^2\theta \tag{44}$$

$$\sigma_2 = \sigma r \sin^2\theta + \sigma t \cos^2\theta \tag{45}$$

$$\tau = 1/2(\sigma r - \sigma t)\sin 2\theta \tag{46}$$

According to the equation (46), the direction of the shear force corresponds to a direction having an angle $\theta$ of 45°. In other words, in both radial and axial directions, the maximum shear force is applied in a direction having an angle of 45°. In a coordinate system in which $\theta$=45°, the stress is homogeneous:

$$\sigma_1 = \sigma_2 = -\sigma_0\left(1 - \frac{2m-1}{m-1}\frac{r^2}{R^2}\right) \tag{47}$$

and the maximum shear force is given as follows:

$$\tau = \frac{m\sigma_0}{m-1}\frac{r^2}{R^2} \tag{48}$$

The shear rorce is zero when r is zero and increases in proportional to the square of r ($r^2$).

Each stress $\sigma_1$ and $\sigma_2$ is $-\sigma_0$, namely compressive stress when r is zero and zero when r is equal to $$r_2 = \left(\frac{m-1}{2m-1}\right)^{-\frac{1}{2}} R \tag{49}$$

When r is larger than $r_2$ and not larger than R, each stress is positive, namely tensile stress.

When r is R, $$\sigma_1 = \tau = m\sigma_0/(m-1) \tag{50}$$

Since the boundary condition $\sigma r$=0 is given when r is R, it is natural that $\sigma_1$ is equal to $\tau$.

Generally, Poisson's ratio m of a solid material is said to be from about 3 to about 4. However, under an extreme condition nears a liquid state, the ratio m approaches 2. Just after it is pulled up, the single crystal is still flowable and its m is close to 2. Then, the absolute value of $\sigma_1 = \tau$ in the equation (50) in which r=R is about twice larger than that of $\sigma_1 = -\sigma_0$ when r=R.

The stress is large at the periphery of the crystal and maximum at the core of the crystal (r=0), while it is smaller in the intermediate area (near $r_2$)

The left half of FIG. 3 shows the stress $\sigma_1 (=\sigma_2)$ and $\tau$ in the coordinate system in which $\theta$=45°.

If EPD were increased by the shear force $\tau$, EPD should be minimum when r=0 and monotonously increase toward the periphery. But, this is not so. EPD is large at the center and periphery of the crystal and small in the intermediate area. Since the shear force increases in proportion to $r^2$, Mil'vidsky's theory cannot explain the W figure distribution of EPD in the radial direction. Rather, it can be said that the fact that EPD has the W figure distribution corresponds to the change of the principal stress $\sigma_1$, because the absolute value of the main stress is maximum at the periphery, zero when r=$r_2$, and about a half of the maximum value when r=0.

SUMMARY OF THE INVENTION

One object of the invention is to provide a GaAs single crystal having less lattice defects than the conventional ones by the addition of an impurity.

Another object of the invention is to provide a GaAs single crystal in which the impurity is homogeneously distributed and, therefore, from which a wafer having a uniform characteristics is produced.

A further object of the invention is to provide a process for preparing a GaAs single crystal of the invention.

Accordingly, the present invention provides a GaAs single crystal containing at least one impurity selected from the group consisting of In, Al, C and S, in which fluctuation of the concentration of the impurity is less that 20% throughout the crystal.

Further, the present invention provides a process for preparing a GaAs single crystal of the invention comprising, at a high temperature and under high pressure, pulling up the single crystal from a raw material melt containing simple substances Ga and As or a GaAs compound as well as at least one impurity selected from the group consisting of In, Al, C and S while controlling the concentration of As so as to keep a distribution coefficient of the impurity in GaAs within $1 \pm 0.1$.

DETAILED DESCRIPTION OF THE INVENTION

The principal stress $\sigma_1$ may more strongly relate to the mechanism of the generation of the dislocation than the shear force. The principal stress $\sigma_1$ has different contribution to the amount of EPD whether it is positive (tensile stress) or negative (compressive stress). Further, the shear force may generate the dislocation.

Now, introducing a displacement inducing coefficient, which includes a tensile coefficient $\alpha$, a compressive coefficient $\beta$ and a shear coefficient $\gamma$, and is defined by the number of generated EPD per unit value of the square of the stress. When r is smaller than $r_2$, the stress is compressive and when larger than $r_2$, tensile. Thus, the above theory may be represented as follows:

(i) when $0 > r < r_2$, $$EPD = \beta\sigma^2 + \gamma\tau^2 \qquad (51)$$

(ii) when $r_2 < r \leq R$, $$EPD = \alpha\sigma^2 + \gamma\sigma^2 \qquad (52)$$

wherein $\sigma$ is used in place of $\sigma_1$.

The reason why $\sigma$ and $\beta$ are not zero is explained by the W figure distribution of EPD. This is contrary to the Mil'vidsky theory.

In the present theory, $\tau$ is also taken into account, which relates to orientation of EPD. If EPD has orientation, it cannot be interpreted by the principal stress $\sigma_1$. However, orientation of frequency of the EPD generation is rationally explained by $\tau$.

The reason for this is as follows:

The most easily displaceable direction by the shear force is a cleavage direction. The cleveage direction of the GaAs crystal is $<110>$, etc. The crystal pulled up in the $<001>$ direction has two cleavage directions rectangular with each other and non-cleavage directions $<100>$ having an angle ot 45° to the cleavage directions.

Along a radial direction, the shear force is maxrmum in a direction at an angle of 45° to the radial direction. When the radial direction corresponds to the non-cleavage direction $<100>$, the direction of the shear force corresponds to the cleavage direction. If the dislocation were generated by the shear force, more dislocation would be generated in $<100>$ than in $<110>$.

Figure 4:
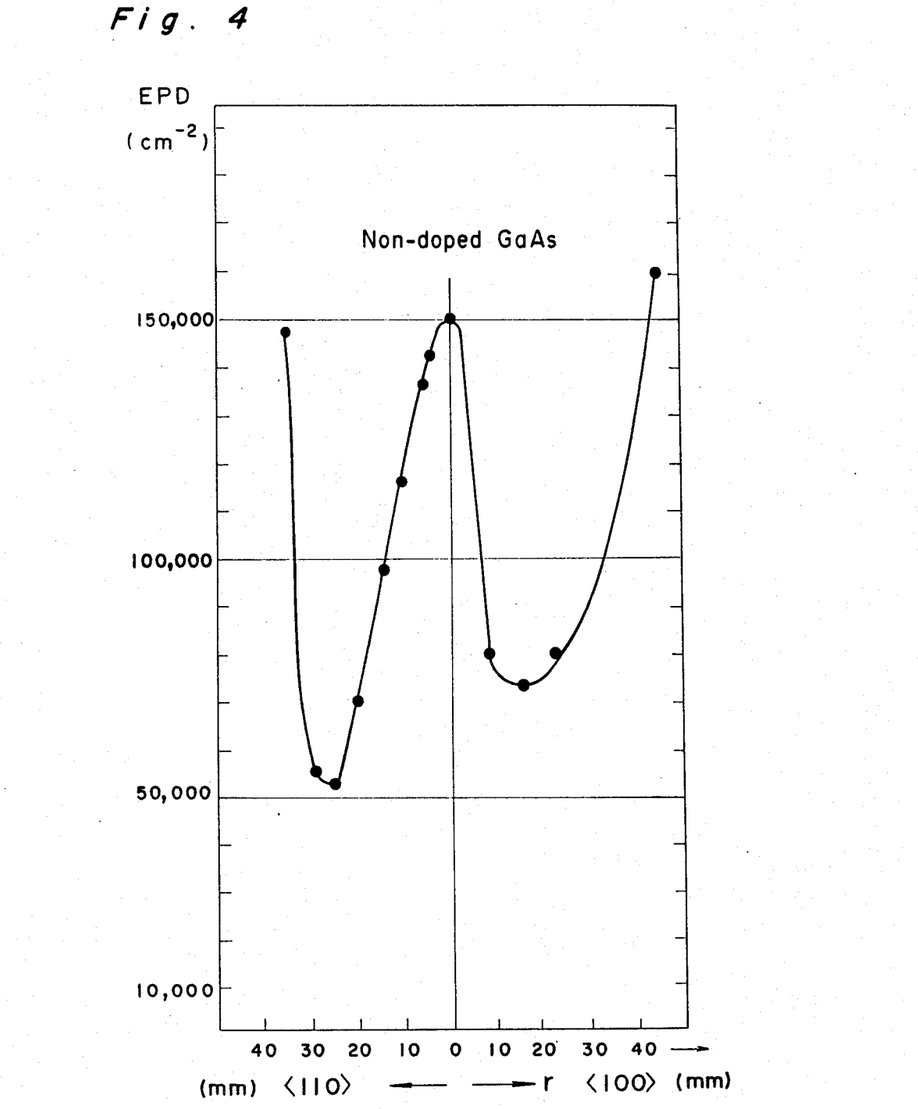
FIG. 4 shows EPD of a non-doped GaAs single crystal in the $<100>$ or $<110>$ direction as a function of the radius r.

This is supported by the data shown in FIG. 4, which shows EPD distributions in $<100>$ and $<110>$ directions of a wafer produced by slicing a non-doped GaAs single crystal and etching it. The used GaAs single crystal was one produced by means of a JUMBO furnace manufactured by Cambridge Instruments, England.

EPD is from 50,000 to 160,000/cm$^2$. At the core and periphery, it is about 150,000/cm$^2$. Minimum EPD in the $<110>$ direction is 50,000/cm$^2$ and that in the $<100>$ direction is 70,000/cm$^2$. These results corresponds to the fact that $\tau$ is to be taken into consideration in the equations (51) and (52). The reason why the $<100>$ direction has a larger EPD is that $\tau$ corresponds to the cleavage direction as described above. It may be supposed that $\gamma$ is large in the $<100>$ direction, or that, if a direction in which EPD is measured is at an angle of $\theta$ to the cleavage direction, the shear coefficient is defined as follows:

$$\gamma = \gamma_0(\epsilon + \sin^2 2\theta) \qquad (53)$$

wherein $\gamma_0$ and $\epsilon$ are constants.

In detail, r at which EPD is minimum is a different in both directions. $<110>$ direction, minimum at r=2.7 cm $<100>$ direction, minimum at r=1.5 cm These results are also rationally explained by the equations (51) and (52). Since the $<110>$ direction is the cleavage direction, $\gamma$ is small in this direction. Therefore, a point at which EPD is minimum (this is smaller than $r_2$) approaches $r_2$. Since $\gamma$ is large in the $<100>$ direction, a point at which EPD is minimum goes away from $r_2$. Because of this, the point at which EPD is minimum in the $<100>$ direction is nearer to r=0 (zero).

From the equations (51) and (52), the point $r_3$ at which EPD is minimum is represented as follows:

$$r_3 = R \left[ \frac{\beta(2m-1)(m-1)}{(2m-1)^2\beta + m^2\gamma_0(\epsilon + \sin^2 2\theta)} \right]^{\frac{1}{2}} \quad (54)$$

wherein r is smaller than $r_2$.

When R=4 cm, the approximate ratio in an example in FIG. 4 is calculated as follows:

$$\frac{m^2\gamma_0}{(2m-1)^2\beta} = 2.2 \quad (55)$$

in which $\epsilon$ is neglected, since it is very small. When Poisson's ration m is 2, 3 and 4, the ratio $\gamma_0/\beta$ is about 5, 6 and 7, respectively. These results show that if $\gamma$ is known, non-symmetry in the <100> and <110> directions is explained.

Figure 5:
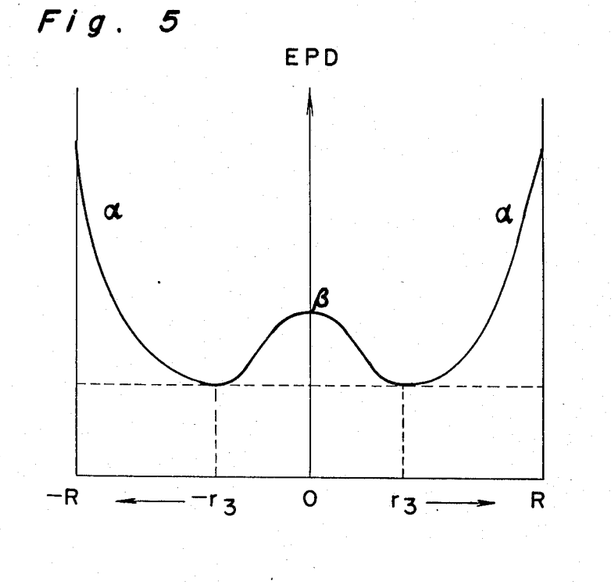
FIG. 5 shows the EPD function in the radial direction of the single crystal according the present invention.

FIG. 5 shows EPD values calculated from the equation (51) and (52) according to the present invention, which demonstrates the equations are W figure functions. EPD values at r=0, r=$r_3$ and r=R are as follows:
(i) r=0

$$EPD = \beta\sigma_0^2 \quad (56)$$

(ii) r=$r_3$ $$EPD = \frac{\beta\gamma m^2}{\beta(2m-1)^2 + \gamma m^2} \sigma_0^2 \quad (57)$$

(Minimum EPD)

(iii) r=R $$EPD = \left( \frac{m}{m-1} \right)^2 (\alpha + \gamma)\sigma_0^2 \quad (58)$$

(Maximum EPD)

According to the present invention, the thermal expansion coefficient $\sigma_1$ in $\sigma_0$ is considered to decrease by the addition of the impurity but the coefficients $\sigma$, $\beta$ and $\gamma$ are not changed.

Since EPD increases as the diameter of the single crystal increases according to equation (41), it is understood that it is particularly difficult to decrease EPD when a single crystal having a larger diameter is to be pulled up. Since, however, the addition of the impurity decreases $\sigma_1$, the whole EPD can decrease.

The present invention will be hereinafter explained by using In as an impurity.

In the Willardson's theory, the diffusion coefficient k plays a major role, and it is 0.1.

G. Jacob et al, Journal of Crystal Growth, 61, 417–424, 1983 says that k of In is 0.007. This difference is due to the difference of the concentration of As in GaAs. That is, the distribution coefficient of In in GaAs varies with the As concentration in GaAs.

J. Brice shows that the distribution coefficients of In, Al, C and S vary with the concentration and vapor pressure of As in a GaAs melt as shown in FIG. 6 (cf. Atomic Diffusion Semiconductors, Plenum, N.Y.).

As discussed above with reference to the equation (1), when k is not equal to one, the concentration of the impurity varies with the solidified ratio g. Thus, it is not desirable that the concentration of the impurity changes. Willardson et al believe that it is preferred that k is much smaller than one while Jacob thinks it better that k is larger than one. On the contrary, according to the invention, a k of one (1) may be the best because if the concentration of the impurity increases at the lower part of the crystal being pulled up, polycrystal tends to form at that part, or if the concentration of the impurity varies, wafers having the same characteristics are not produced from such a single crystal.

Thus, in the process of the invention, the GaAs single crystal is pulled up while keeping the conditions to achieve k=1±0.1.

Figure 6:
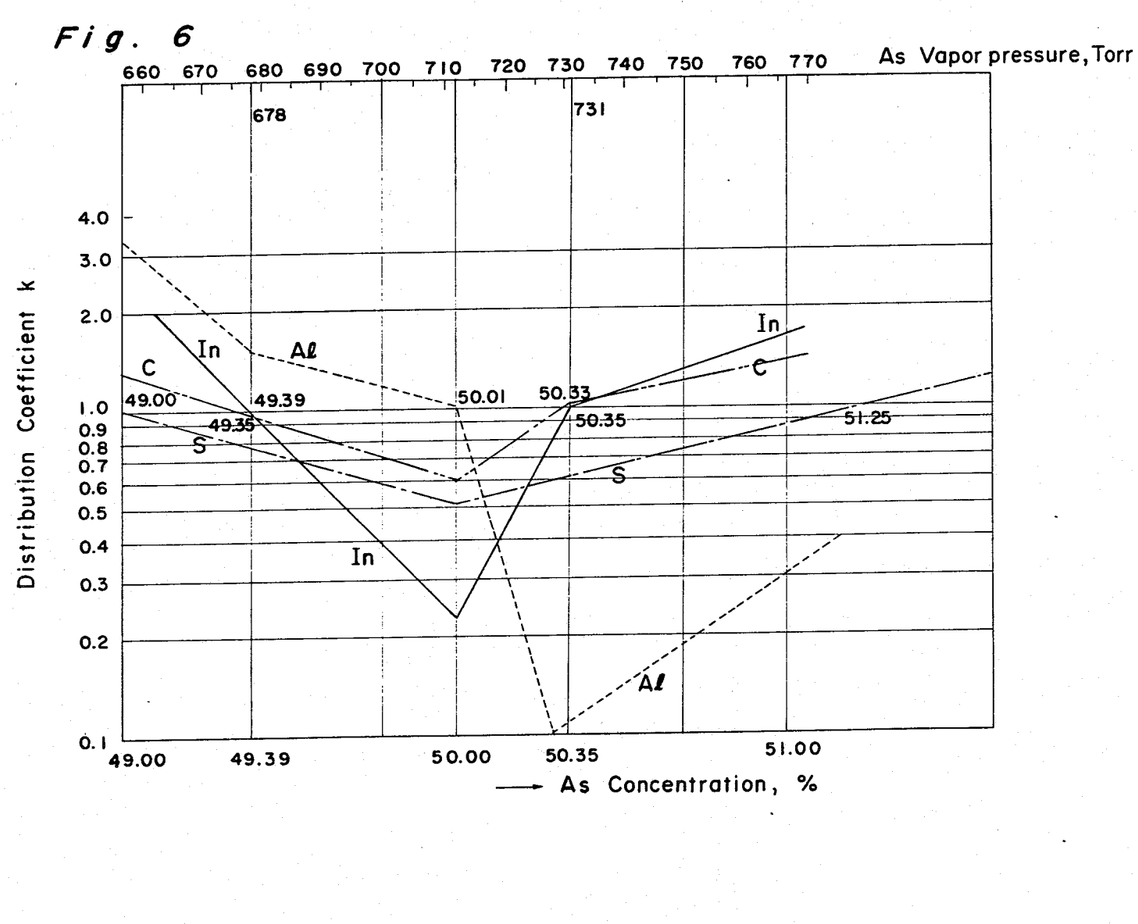
FIG. 6 shows the variation of the distribution coefficients of In, Al, C and S depending on the As concentration or the As partial pressure in GaAs according to J. Bric.

In FIG. 6, the lower and upper abscissas represent the concentration and vapor pressure of As, respectively. The As concentration is by atomic percents. When it is 49.39% and 50.35%, that is, the As vapor pressure is 678 Torr and 731 Torr, k is equal to one in the case of In impurity.

The vapor pressure of As is controlled as follows:

In the CZ method, the raw material melt in the crucible is not covered with any other melt material so that As maintains equilibrium pressure against As pressure in the chamber. In the chamber, a reservoir of As is provided and its temperature is controlled so as to keep the As vapor pressure to either of the above values.

When the raw material is covered with a melt material, a heat-resistant tube is passed through the covering material to connect the raw material with As in the reservoir. In this case, the raw material consists of 49.3% or 50.35% of As and the rest of Ga and covered with, for example, $B_2O_3$ melt. Since As is removed through $B_2O_3$, the As partial pressure in the chamber is adequately controlled by the As contained in the reservoir. Once the partial pressure of As is equilibrated, the As concentration in the raw material is kept constant.

In order to maintain deviation of k from one within about ±0.1, it is preferred to control the As concentration within ±0.1%, which corresponds to ±5 Torr of the partial pressure.

The concentration of In is usually not less than $10^{16}/cm^3$, preferably not less than $10^{18}/cm^3$ and more preferably not less than $10^{19}/cm^3$.

When the distribution coefficient is always kept within 1±0.1, the concentration of In is made substantially constant throughout the GaAs single crystal, and, therefore, the wafers having substantially the same characteristics can be produced.

Fluctuation of the concentration of In is given by the following equation:

$$Q = \frac{(<(In - <In>)^2>)^{\frac{1}{2}}}{<In>} \quad (59)$$

wherein < > means average. If the fluctuation Q is not larger than 20%, the variation of the characteristics of the wafer is not significant in the production of electronic devices.

In a similar way, the GaAs single crystal is prepared by adding Al, C or S as an impurity.

In the case of the Al impurity, k is equal to one when the As concentration is 50.01%.

In the case of the C impurity, k is equal to one when the As concentration is 49.35% and 50.33%.

In the case of the S impurity, k is equal to one when the As concentration is 49.00% and 51.25%.

The relation between the pressure P and concentration C of As is as follows:

P=55.21C−2048.7   (60)

Thus, the As vapor pressure corresponding to the above concentrations are, in the case of the Al impurity, 712.3 Torr., in the case of the C impurity, 675.9 and 730.0 Torr., and in the case of the S impurity, 656.5 and 780.7 Torr.

When In or Al is used as the impurity, a semiinsulating GaAs crystal is obtained.

When S is used as the impurity, a n-type semiconductive crystal is obtained.

When C is used as the impurity, a p-type semiconductive crystal is obtained.

The present invention will be explained in further detail by the following Example.

EXAMPLE

In a crucible of 4 inches in diameter, GaAs polycrystal (2 kg) is charged in which In (4 g) is added, and in an As reservoir, As (50 g) is charged.

Figure 7:
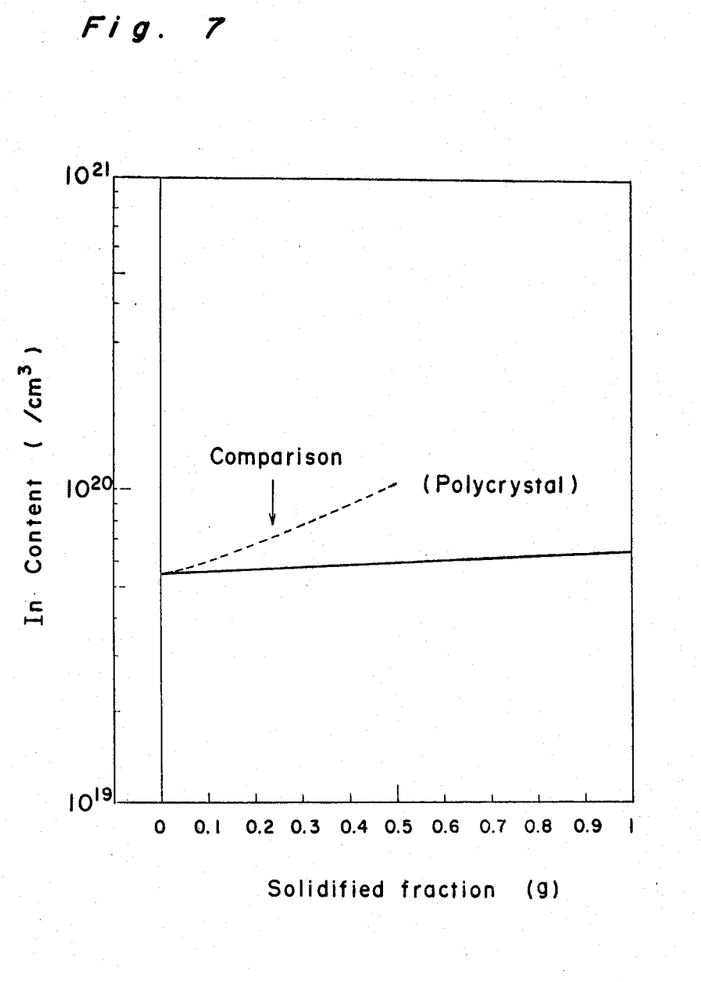
FIG. 7 shows the distribution of In in the crystals obtained in Example.

The temperature of the As reservoir is controlled to keep As pressure at 731 Torr. A seed crystal is dipped in the GaAs polycrystal melt containing In and pulled up while rotating it as well as the crucible to grow GaAs single crystal of about 50 mm in diameter and about 18 cm in length. Distribution of In along the growth direction of the single crystal is shown in FIG. 7.

When As pressure is kept at 731 Torr., according to the present invention, the distribution of In in the single crystal is substantially homogeneous and its fluctuation from the top to the bottom is about 17%.

For comparison, in the crucible, GaAs (2 kg), In (40 g) and $B_2O_3$ (150 g) are charged and a single crystal of 50 mm in diameter is pulled up without controlling the As pressure. As the solidified fraction g increases, the In content increases, and the crystal obained at the solidified fraction larger than 0.5 is polycrystal. The distribution of In in the comparative experiment is also shown in FIG. 7.

In addition, when As pressure is kept at 731 Torr., EPD is homogenous from the top to the bottom of the single crystal and less than 500/cm$^2$.

On the contrary, in the crystal obtained in the comparative experiment, EPD is small from the top to the middle portion, but, from the middle portion to the bottom, a rate of good single crystal is less than 50% of the charged amount due to polycrystalization.

What is claimed is:

1. A GaAs single crystal suitable for use as a transistor, an LED or a laser diode, comprising a GaAs crystal doped with an impurity selected from the group consisting of In, Al, C and S, in which fluctuation of the concentration of said impurity in said crystal is less than 20% in any direction.

2. A GaAs single crystal according to claim 1, wherein the average concentration of the impurity is not less than $10^{16}$/cm$^3$.

3. A GaAs single crystal according to claim 1, wherein the impurity is In.

4. A process for preparing a GaAs single crystal suitable for use as a transistor, an LED or a laser diode, said crystal comprising a GaAs crystal doped with an impurity selected from the group consisting of In, Al, C and S, in which fluctuation of the concentration of said impurity in said crystal is less than 20% in any direction, said process comprising the steps of:

pulling up a single crystal from a raw material melt comprising Ga and As or a GaAs compound as well as at least one impurity selected from the group consisting of In, Al, C and S while controlling the concentration of As so as to keep a distribution coefficient of the impurity in GaAs within 1±0.1.

5. A process according to claim 4, wherein at least a part of a surface of the raw material is not covered, and a reservoir of As is provided in a chamber and the temperature of said reservoir is controlled so as to keep the As vapor pressure in said chamber at a predetermined value.

6. A process according to claim 5, wherein the impurity is In, and the As vapor pressure is kept at 687±5 Torr. or 731±5 Torr.

7. A process according to claim 4, wherein the impurity is In, and the concentration of As in the raw material melt is 49.39±0.1% or 50.35±0.1%.

8. A process according to claim 7, wherein the raw material melt is covered by a melt and connected with the reservoir in the chamber containing As so as to keep the concentration of As in the raw material melt constant.

* * * * *